(12) United States Patent
Nelson et al.

(10) Patent No.: US 11,949,169 B2
(45) Date of Patent: Apr. 2, 2024

(54) HIGH FREQUENCY AND HIGH POWER THIN-FILM COMPONENT

(71) Applicant: KYOCERA AVX Components Corporation, Fountain Inn, SC (US)

(72) Inventors: Cory Nelson, Murrells Inlet, SC (US); Gheorghe Korony, Myrtle Beach, SC (US)

(73) Assignee: KYOCERA AVX Components Corporation, Fountain Inn, SC (US)

( * ) Notice: Subject to any disclaimer, the term of this patent is extended or adjusted under 35 U.S.C. 154(b) by 34 days.

(21) Appl. No.: 17/676,889

(22) Filed: Feb. 22, 2022

(65) Prior Publication Data

US 2022/0278453 A1   Sep. 1, 2022

Related U.S. Application Data

(60) Provisional application No. 63/154,045, filed on Feb. 26, 2021.

(51) Int. Cl.
| | | |
|---|---|---|
| *H01Q 1/22* | (2006.01) | |
| *H01L 27/08* | (2006.01) | |
| *H01L 49/02* | (2006.01) | |
| *H01Q 5/314* | (2015.01) | |

(52) U.S. Cl.
CPC ............. *H01Q 5/314* (2015.01); *H01L 27/08* (2013.01); *H01L 28/20* (2013.01); *H01Q 1/2283* (2013.01)

(58) Field of Classification Search
CPC ......... H01L 27/08; H01L 27/02; H01L 27/04; H01L 28/20; H01P 5/12; H01P 5/16; H01Q 1/22; H01Q 1/2283; H01Q 1/38; H01Q 5/31; H01Q 5/314; H01Q 5/33; H01Q 5/335; H01Q 21/06
See application file for complete search history.

(56) References Cited

U.S. PATENT DOCUMENTS

| | | | | | |
|---|---|---|---|---|---|
| 4,120,744 | A | * | 10/1978 | Payne | ............... H01L 21/76264 257/586 |
| 4,285,001 | A | * | 8/1981 | Gerzberg | ................ H01L 28/20 257/E29.345 |
| 5,567,977 | A | * | 10/1996 | Jimenez | ............ H01L 29/66166 257/536 |

(Continued)

FOREIGN PATENT DOCUMENTS

| | | |
|---|---|---|
| JP | 2012195755 A | 10/2012 |
| JP | 2015220727 A | 12/2015 |

OTHER PUBLICATIONS

International Search Report and Written Opinion for PCT/US2022/017208 dated Jun. 9, 2022, 11 pages

*Primary Examiner* — Tho G Phan
(74) *Attorney, Agent, or Firm* — Dority & Manning, P.A.

(57) ABSTRACT

A resistive splitter can include a monolithic substrate and a patterned resistive layer formed over the monolithic substrate. The resistive splitter can include a first terminal, a second terminal, and a third terminal each connected with the patterned resistive layer. The resistive splitter can include at least one frequency compensating conductive layer formed over a portion of the patterned resistive layer. In some embodiments, the resistive splitter can exhibit a first insertion loss response between the first terminal and the second terminal that is greater than about −10 dB for frequencies ranging from about 0 GHz up to about 30 GHz.

29 Claims, 11 Drawing Sheets (56) References Cited

U.S. PATENT DOCUMENTS

| | | | |
|---|---|---|---|
| 6,365,483 B1 * | 4/2002 | Lin | H01L 28/20 |
| | | | 257/E21.004 |
| 6,570,466 B1 * | 5/2003 | Bahl | H01P 5/12 |
| | | | 333/127 |
| 6,709,944 B1 * | 3/2004 | Durocher | B29C 59/14 |
| | | | 438/384 |
| 8,665,059 B2 | 3/2014 | Korony et al. | |
| 9,083,069 B2 | 7/2015 | Iio | |
| 9,148,114 B2 | 9/2015 | Tseng et al. | |
| 10,811,751 B2 | 10/2020 | Ramaswamy et al. | |
| 11,437,695 B2 | 9/2022 | Marek et al. | |

* cited by examiner

HIGH FREQUENCY AND HIGH POWER THIN-FILM COMPONENT

CROSS REFERENCE TO RELATED APPLICATION

The present application claims filing benefit of U.S. Provisional Patent Application Ser. No. 63/154,045 having a filing date of Feb. 26, 2021, which is incorporated herein by reference in its entirety.

BACKGROUND OF THE INVENTION

High frequency radio signal communication has increased in popularity. For example, the demand for increased data transmission speed for wireless connectivity has driven demand for high frequency components, including those configured to operate at 5G spectrum frequencies. At the same time, a trend towards miniaturization has increased the demand for smaller passive components.

High frequency radio signal communication can include a variety of signal processing, such as signal splitting. Signal splitters can receive an input signal and evenly divide the input signal into a first output signal and a second output signal. A compact splitter that is capable of operating at high frequencies, including 5G frequencies, would be welcomed in the art.

SUMMARY OF THE INVENTION

In accordance with one embodiment of the present disclosure, a resistive splitter can include a monolithic substrate and a patterned resistive layer formed over the monolithic substrate. The resistive splitter can include a first terminal, a second terminal, and a third terminal each connected with the patterned resistive layer. The resistive splitter can include at least one frequency compensating conductive layer formed over a portion of the patterned resistive layer.

In accordance with another embodiment of the present disclosure, a resistive splitter can include a monolithic substrate and a patterned resistive layer formed over the monolithic substrate. The resistive splitter can include a first terminal, a second terminal, and a third terminal each connected with the patterned resistive layer. The resistive splitter can exhibit a first insertion loss response between the first terminal and the second terminal that is greater than about −10 dB for frequencies ranging from about 0 GHz up to about 30 GHz.

In accordance with another embodiment of the present disclosure, a method for forming a resistive splitter can include forming a patterned resistive layer on a surface of a monolithic substrate; depositing a first terminal, a second terminal, and a third terminal over the surface of the monolithic substrate such that each of the first terminal, the second terminal, and the third terminal connect with the patterned resistive layer; and depositing at least one frequency compensating conductive layer over a portion of the patterned resistive layer.

BRIEF DESCRIPTION OF THE DRAWINGS

A full and enabling disclosure of the present invention, including the best mode thereof, directed to one of ordinary skill in the art, is set forth more particularly in the remainder of the specification, which makes reference to the appended figures, in which.

Repeat use of reference characters in the present specification and drawings is intended to represent same or analogous features or elements of the invention.

DETAILED DESCRIPTION OF REPRESENTATIVE EMBODIMENTS

It is to be understood by one of ordinary skill in the art that the present discussion is a description of exemplary embodiments only, and is not intended as limiting the broader aspects of the present invention, which broader aspects are embodied in the exemplary construction.

Generally speaking, the present invention is directed to a surface mount resistive splitter having excellent performance characteristics at high frequencies. The resistive splitter can employ a configuration that evenly splits an input signal applied to a first terminal into a first output signal at a second terminal and a second output signal at a third terminal.

The resistive splitter can exhibit a first insertion loss response between the first terminal and the second terminal and a second insertion loss response between the first terminal and the third terminal. The first insertion loss and/or second insertion loss response that can be greater than about −10 dB for frequencies ranging from about 0 GHz up to about 30 GHz between the first terminal and the second terminal, in some embodiments greater than about −9 dB, and in some embodiments greater than −8 dB, in some embodiments greater than about −7 dB, in some embodiments greater than about −6 db.

The insertion loss response curves can generally be closely matched such that the input signal is evenly split between the second terminal and the third terminal. For example, the second insertion loss response can vary from the first insertion loss less than 3 dB for frequencies ranging from about 0 GHz to about 30 GHz, in some embodiments less than about 2 dB, in some embodiments less than about 1 dB, in some embodiments less than about 0.5 dB, in some embodiments less than about 0.3 dB, and in some embodiments less than about 0.1 db.

The resistive splitter can include a monolithic substrate and a patterned resistive layer formed over the monolithic substrate. The monolithic substrate can be or include a variety of suitable materials. For example, monolithic substrate can be or include a variety of ceramic materials, such as aluminum oxide (alumina), aluminum nitride, beryllium oxide, oron nitride, silicon nitride, magnesium oxide, zinc oxide, silicon carbide, any suitable ceramic material, and mixtures thereof. The monolithic substrate can be or include silicon (Si), glass, and glass-ceramic materials.

The resistive layer may be formed using a variety of thin film techniques, including photolithography or any other suitable patterning technique, etching, PECVD (Plasma Enhanced Chemical Vapor Deposition) processing, or other additive and/or subtractive techniques. The resistive layer may be formed from a variety of suitable resistive materials. For example, the resistive layer may include tantalum nitride (TaN), nickel chromium (NiCr), tantalum aluminide, chromium silicon, titanium nitride, titanium tungsten, tantalum tungsten, oxides and/or nitrides of such materials, and/or any other suitable thin film resistive materials. The resistive layer may have any suitable thickness. For example, in some embodiments a thickness of the resistive layer may range from about 0.001 µm to about 1,000 µm, in some embodiments from about 0.01 µm to about 100 µm, in some embodiments from about 0.1 µm to about 50 µm, in some embodiments from about 0.5 µm to about 20 µm.

The resistive splitter can include a first terminal, a second terminal, and a third terminal. Each of the first terminal, the second terminal, and the third terminal can connect with the patterned resistive layer. One or more frequency compensating conductive layers can be formed over the patterned resistive layer. The frequency compensating conductive layer may contribute to the resistive splitter's excellent high frequency response characteristics.

In some embodiments, the frequency compensating conductive layer may be formed using thin-film methods. For example, the frequency compensating conductive layer be formed using a variety of thin film techniques, including photolithography or any other suitable patterning technique, etching, PECVD (Plasma Enhanced Chemical Vapor Deposition) processing, or other additive and/or subtractive techniques. The frequency compensating conductive layer, however, may be formed using any suitable technique, such as printing, dipping, striping, or other techniques for forming conductive layers.

The frequency compensating conductive layer may be formed from a variety of suitable conductive materials. For example, the frequency compensating conductive layer may include aluminum, copper, gold, silver, nickel, mixtures thereof, and/or any other suitable metals, metal-filled polymeric materials, or any other suitable conductive materials.

The frequency compensating conductive layer(s) may have any suitable thickness. For example, in some embodiments a thickness of the frequency compensating conductive layer may range from about 0.001 µm to about 1,000 µm, in some embodiments from about 0.01 µm to about 100 µm, in some embodiments from about 0.1 µm to about 50 µm, in some embodiments from about 0.5 µm to about 20 µm.

The patterned resistive layer can form a first resistive path between the first terminal and the second terminal. The patterned resistive layer can form a second resistive path between the first terminal and the third terminal. A ratio of a length of the first resistive path to a length of the second resistive path range from 0.9 to 1.1, in some embodiments from about 0.95 to about 1.05, and in some embodiments from about 0.97 to about 1.03, and in some embodiments from about 0.98 to about 1.02.

The patterned resistive layer can include a central portion, a first leg elongated and connected between the first terminal and the central portion of the patterned resistive layer, a second leg elongated and connected between the second terminal and the central portion of the patterned resistive layer, and a third leg elongated and connected between the third terminal and the central portion of the patterned resistive layer.

In some embodiments, the first leg, the second leg, and the third leg can be equally spaced and distanced about a central point. For example, respective angles can be formed between the terminals with respect to the central point.

In some embodiments, the first leg, the second leg, and the third leg can generally form a T shape. In some embodiments, the first leg, the second leg, and the third leg can generally form a triangular shape.

A first frequency compensating conductive layer can be formed over the first leg. A second frequency compensating conductive layer can be formed over the second leg. A third frequency compensating conductive layer can be formed over the third leg. The central portion of the patterned resistive layer can be free of any conductive layers formed thereover.

In some embodiments, two or more the frequency compensating conductive layers can have the same or similar surface areas. For example, the first frequency compensating conductive layer can have a first surface area. The second frequency compensating conductive layer can have a second surface area that is approximately equal to the first surface area. For example, a ratio of the first surface area to the second surface area can range from about 0.9 to about 1.1, in some embodiments from about 0.95 to about 1.05, and in some embodiments from about 0.97 to about 1.03, and in some embodiments from about 0.98 to about 1.02.

The third frequency compensating conductive layer can have a third surface area that is approximately equal to the first surface. For example, a ratio of the first surface area to the third surface area ranges from about 0.9 to about 1.1, in some embodiments from about 0.95 to about 1.05, and in some embodiments from about 0.97 to about 1.03, and in some embodiments from about 0.98 to about 1.02.

According to aspects of the present disclosure, a resistive splitter can include a first terminal, a second terminal, and a third terminal that are equally spaced and distanced about a central point. For example, respective angles can be formed between the terminals with respect to the central point.

The frequency compensating conductive layer can be formed over the central point. The frequency compensating conductive layer can have a shape that appears the same to a current flow from each terminal towards the central point. As one example, the frequency compensating conductive layer can have a circular shape that has a center aligned with the central point. As one example, the frequency compensating conductive layer can have a triangular shape. The resistive splitter can include a monolithic substrate and a patterned resistive layer formed over the monolithic substrate. The frequency compensating conductive layer can be formed over the patterned resistive layer and have any suitable shape.

In some embodiments, the frequency compensating conductive layer can be centered about the central point but formed over the central point. That is, the frequency compensative conductive layer can be formed over the patterned resistive layer such that the frequency compensating conductive layer is centered on but does not overlie the central point. In such embodiments, the frequency compensating conductive layer can have a shape that appears the same to a current flow from each terminal towards the central point. As one example, the frequency compensating conductive layer can have a circular or annular shape that has a center aligned with the central point. As another example, the frequency compensating conductive layer can have a hexagonal shape.

One or more protective or passivation layers may be formed over the resistive layers and/or frequency compensating structures. The passivation layer(s) can include a variety of suitable materials such as benzocyclobutene (BCB) polyimide, silicon oxynitride, Al2O3, SiO2, Si3N4, epoxy, glass, or another suitable material. The terminals can include respective vias formed through the passivation layer(s).

In some embodiments, the thin-film component may have a compact size, e.g., footprint. For example, in some embodiments, the thin-film component may have an overall length from about 0.1 mm to about 5 mm, in some embodiments, from about 0.2 mm to about 4 mm, in some embodiments from about 0.3 mm to about 3 mm, in some embodiments, from about 0.4 mm to about 2 mm, e.g., about 1 mm.

In some embodiments the thin-film component may have an overall width from about 0.05 mm to about 2.5 mm, in some embodiments from about 0.1 mm to about 2 mm, in some embodiments from about 0.15 mm to about 1.5 mm, in some embodiments from about 0.2 mm to about 1.3 mm, and in some embodiments from about 0.3 mm to about 1 mm, e.g., about 0.5 mm.

In some embodiments, the thin-film component may have an overall thickness from about 0.05 mm to about 2.5 mm, in some embodiments from about 0.1 mm to about 2 mm, in some embodiments from about 0.15 mm to about 1.5 mm, in some embodiments from about 0.2 mm to about 1.3 mm, and in some embodiments from about 0.3 mm to about 1 mm, e.g., about 0.5 mm.

The resistive splitter can be configured in a variety of surface mounting configurations. For example, the resistive splitter can be configured for grid array type mounting, such as land grid array, ball grid array, etc. However, in other embodiments, external terminations may be formed in part or in whole on side surfaces of the substrate, such as castellations or the like. Any suitable variety of external terminations can be provided for surface mounting the resistive splitter.

Figure 1:
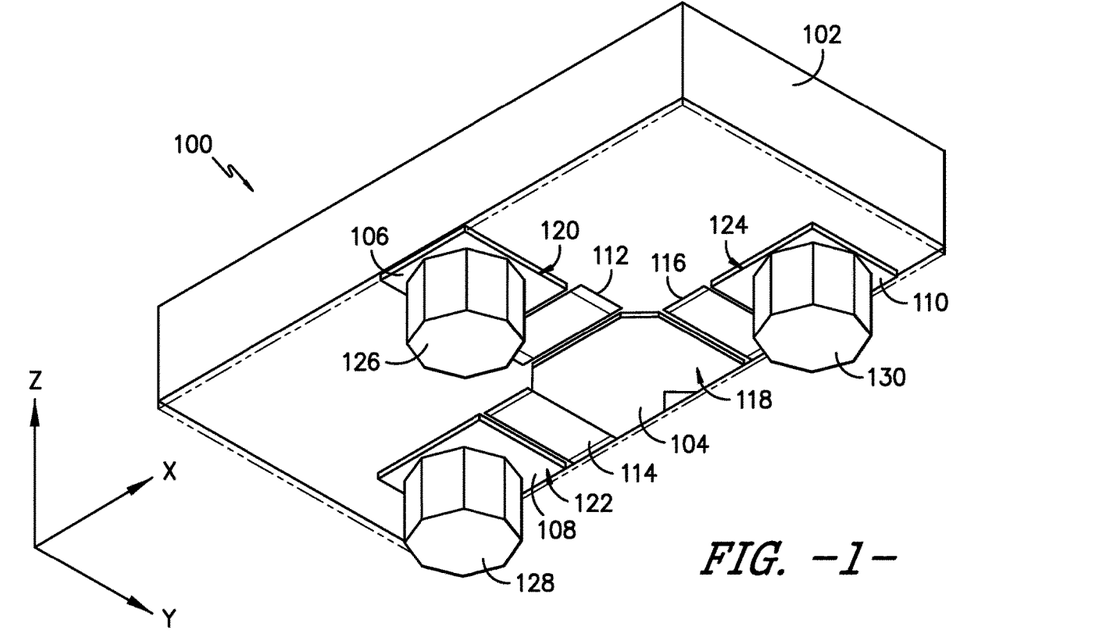
FIG. 1 is a perspective view of one embodiment of a resistive splitter according to aspects of the presently disclosed subject matter.

FIG. 1 is a perspective view of one embodiment of a resistive splitter 100. The resistive splitter 100 can include a monolithic substrate 102 and a patterned resistive layer 104 formed over the monolithic substrate 102. The resistive splitter 100 can include a first terminal 106, a second terminal 108, and a third terminal 110. Each of the first terminal 106, the second terminal 108, and the third terminal 110 can be connected with the patterned resistive layer 104. One or more frequency compensating conductive layers 112, 114, 116 can be formed over the patterned resistive layer 104. The frequency compensating conductive layer(s) 112, 114, 116 can include a variety of suitable conductive materials, such as aluminum, copper, gold, silver, nickel, or mixtures thereof.

The patterned resistive layer 104 can form a first resistive path between the first terminal 106 and the second terminal 108. The patterned resistive layer 104 can form a second resistive path between the first terminal 106 and the third terminal 108. A ratio of a length of the first resistive path to a length of the second resistive path range from 0.9 to 1.1.

The patterned resistive layer 104 can include a central portion 118, a first leg 120 elongated and connected between the first terminal 106 and the central portion 118 of the patterned resistive layer 104, and a second leg 122 elongated and connected between the second terminal 108 and the central portion 118 of the patterned resistive layer 104.

A first frequency compensating conductive layer 112 can be formed over the first leg 120. A second frequency compensating conductive layer 114 can be formed over the second leg 122. A third frequency compensating conductive layer 116 can be formed over the third leg 124. The central portion 118 of the patterned resistive layer 104 can be free of any conductive layers formed thereover.

In some embodiments, two or more of the frequency compensating conductive layers 112, 114, 116 can have the same or similar surface areas. For example, the first frequency compensating conductive layer 112 can have a first surface area. The second frequency compensating conductive layer 114 can have a second surface area that is approximately equal to the first surface area. For example, a ratio of the first surface area to the second surface area can range from about 0.9 to about 1.1. The third frequency compensating conductive layer 116 can have a third surface area that is approximately equal to the first surface area. For example, a ratio of the first surface area to the third surface area ranges from about 0.9 to about 1.1.

One or more protective or passivation layers may be formed over the resistive layer(s) 104 and/or frequency compensating conductive layers 112, 114, 116. The terminals 106, 108, 110 can include respective vias 126, 128, 130 formed through the passivation layer(s) and exposed for surface mounting of the resistive splitter 100.

Figure 2A:
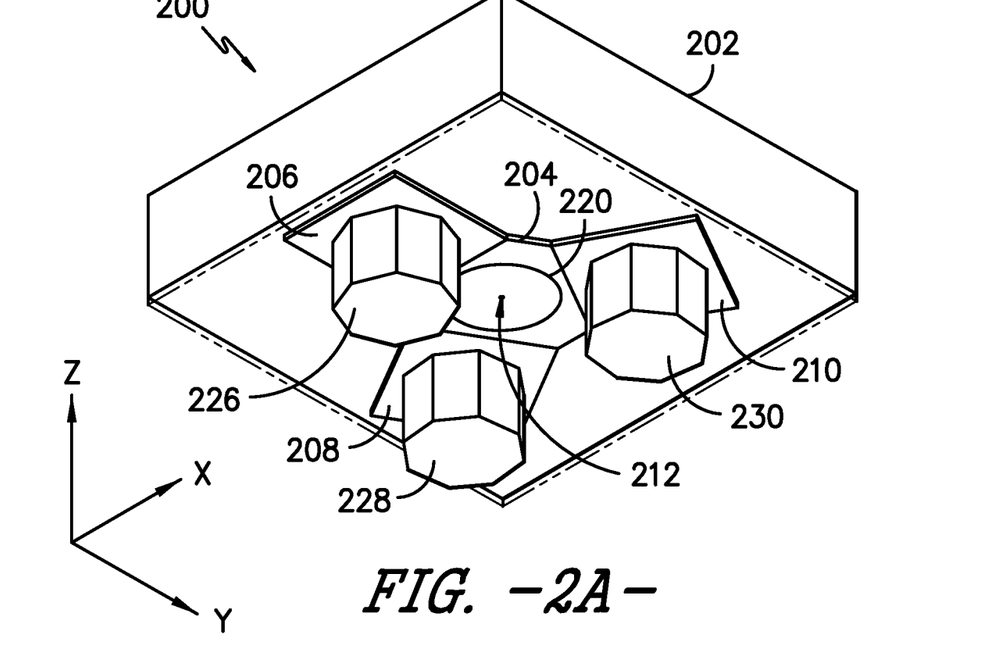
FIG. 2A is a perspective view of another embodiment of a resistive splitter according to aspects of the presently disclosed subject matter.
Figure 2B:
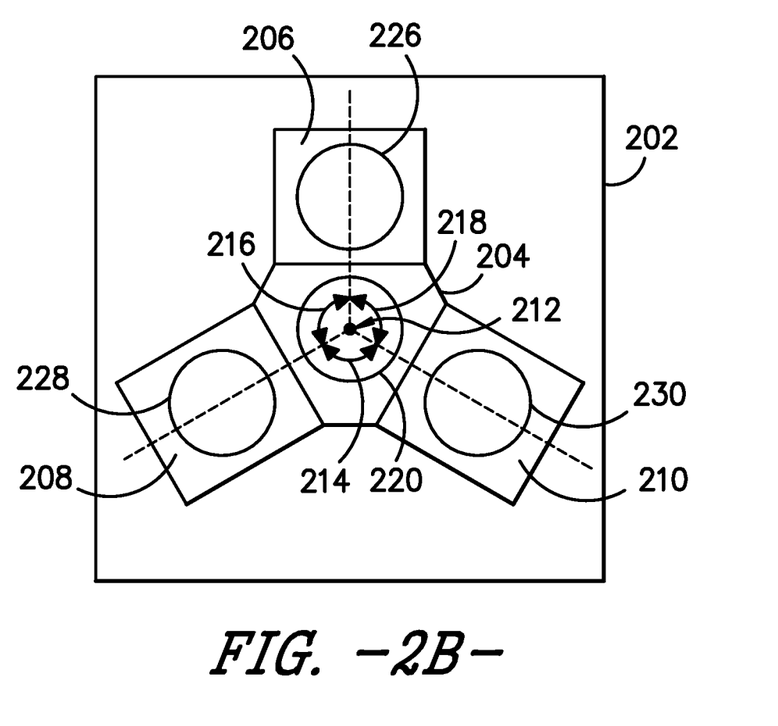
FIG. 2B is a top-down view of the resistive splitter of FIG. 1 according to aspects of the presently disclosed subject matter.

FIG. 2A is a perspective view of one embodiment of a resistive splitter 200. FIG. 2B is a top-down view of the resistive splitter 200 of FIG. 2A. The resistive splitter 200 can include a monolithic substrate 202 and a patterned resistive layer 204 formed over the monolithic substrate 202. The resistive splitter 200 can include a first terminal 206, a second terminal 208, and a third terminal 210. Each of the first terminal 206, the second terminal 208, and the third terminal 210 can be connected with the patterned resistive layer 204.

In some embodiments, the terminals 206, 208, 210 can be equally spaced and distanced about a central point 212. For example, respective angles 214, 216, 218 can be formed between the terminals 206, 208, 210 with respect to the central point 212.

A frequency compensating conductive layer 220 can be formed over the central point 212. One or more protective or passivation layers may be formed over the resistive layer(s) 204 and/or frequency compensating conductive layer 220. The terminals 206, 208, 210 can include respective vias 226, 228, 230 formed through the passivation layer(s) and exposed for surface mounting of the resistive splitter 200.

The frequency compensating conductive layer 220 can have a shape that appears the same to a current flow from each terminal 206, 208, 210 towards the central point 212. As one example, the frequency compensating conductive layer 220 can have a circular shape that has a center aligned with the central point 212.

Figure 3A:
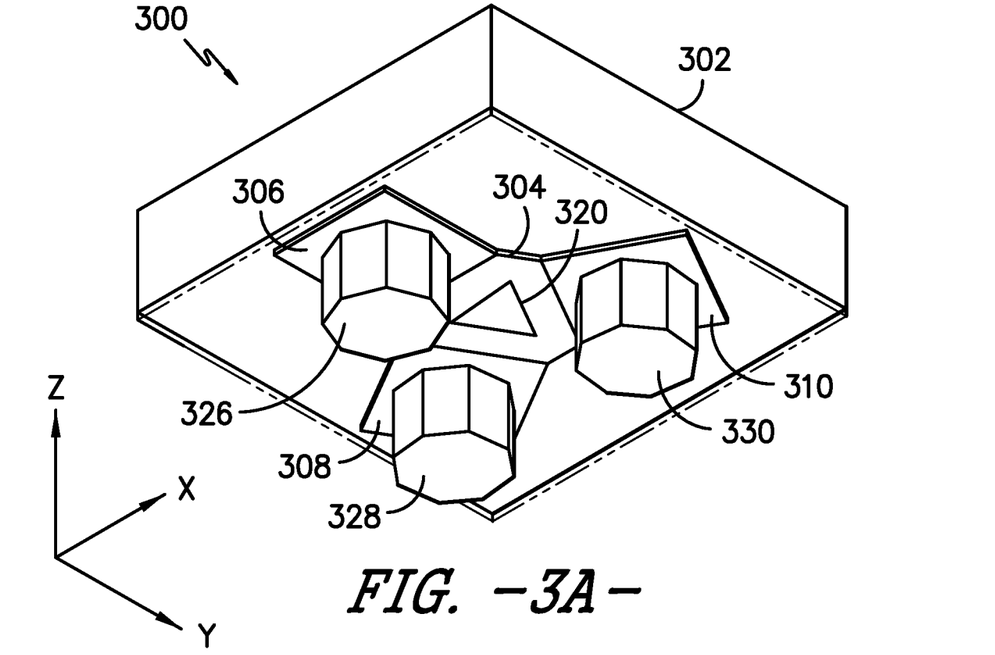
FIG. 3A is a perspective view of another embodiment of a resistive splitter according to aspects of the presently disclosed subject matter.
Figure 3B:
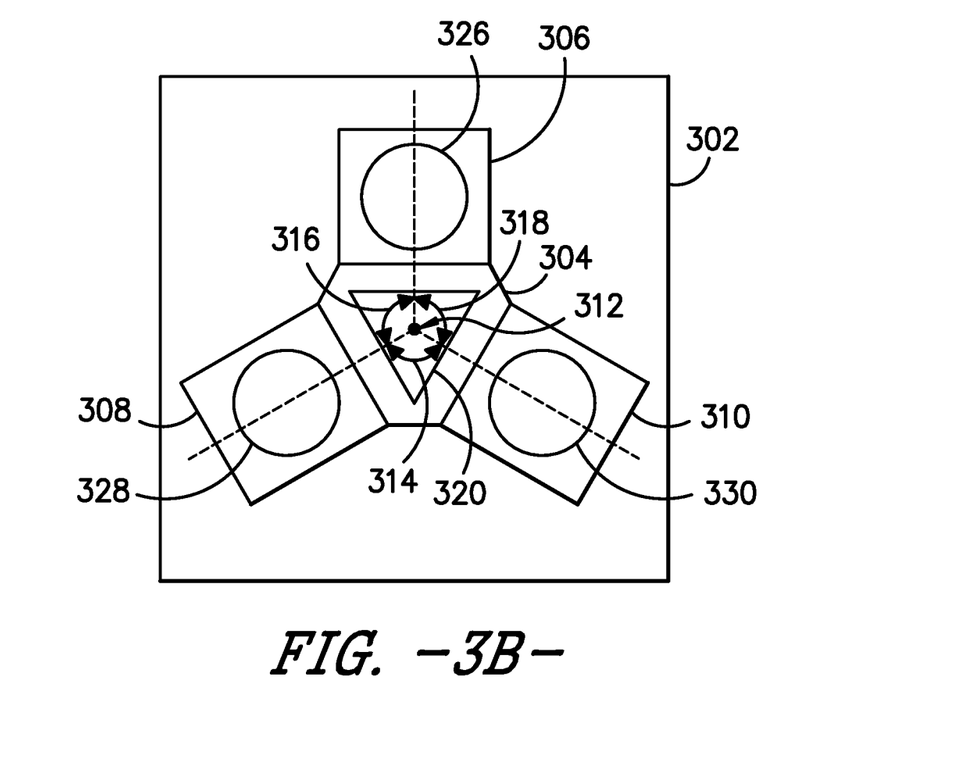
FIG. 3B is a top-down view of the resistive splitter of FIG. 3A according to aspects of the presently disclosed subject matter.

As another example, referring to FIGS. 3A and 3B, the frequency compensating conductive layer 320 can have a triangular shape. Similar reference numbers are used in FIGS. 3A and 3B as FIGS. 2A and 2B. For example, the resistive splitter 300 of FIGS. 3A and 3B can include a monolithic substrate 302 and a patterned resistive layer 304 formed over the monolithic substrate 302. The resistive splitter 300 can include a first terminal 306, a second terminal 308, and a third terminal 310. Each of the first terminal 306, the second terminal 308, and the third terminal 310 can be connected with the patterned resistive layer 304.

Figure 3C:
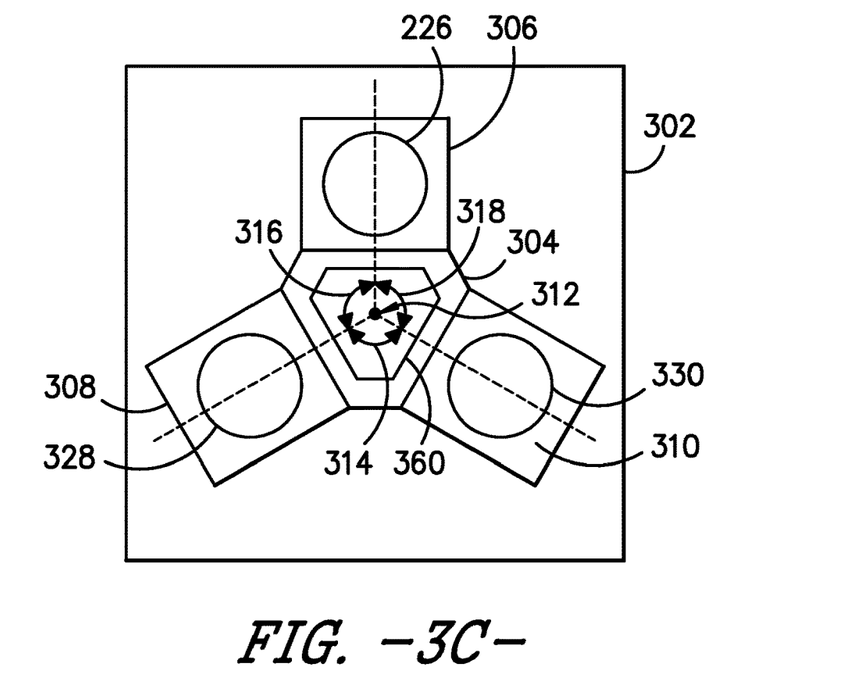
FIG. 3C is a top-down view of another embodiment of a resistive splitter according to aspects of the presently disclosed subject matter.
Figure 3D:
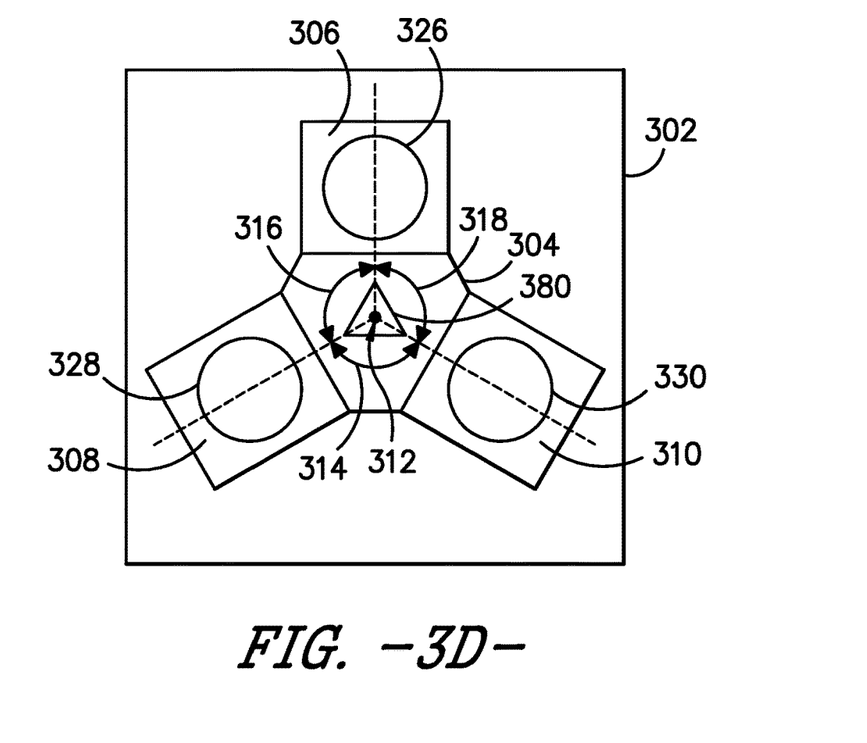
FIG. 3D is a top-down view of another embodiment of a resistive splitter according to aspects of the presently disclosed subject matter.

FIG. 3C illustrates an additional example shape for a frequency compensating conductive layer 360. FIG. 3D illustrates another example shape for a frequency compensating conductive layer 380. However, any suitable shape that affects respective current flows from each terminal 306, 308, 310 toward the central point 312 the same can be employed.

Figure 4A:
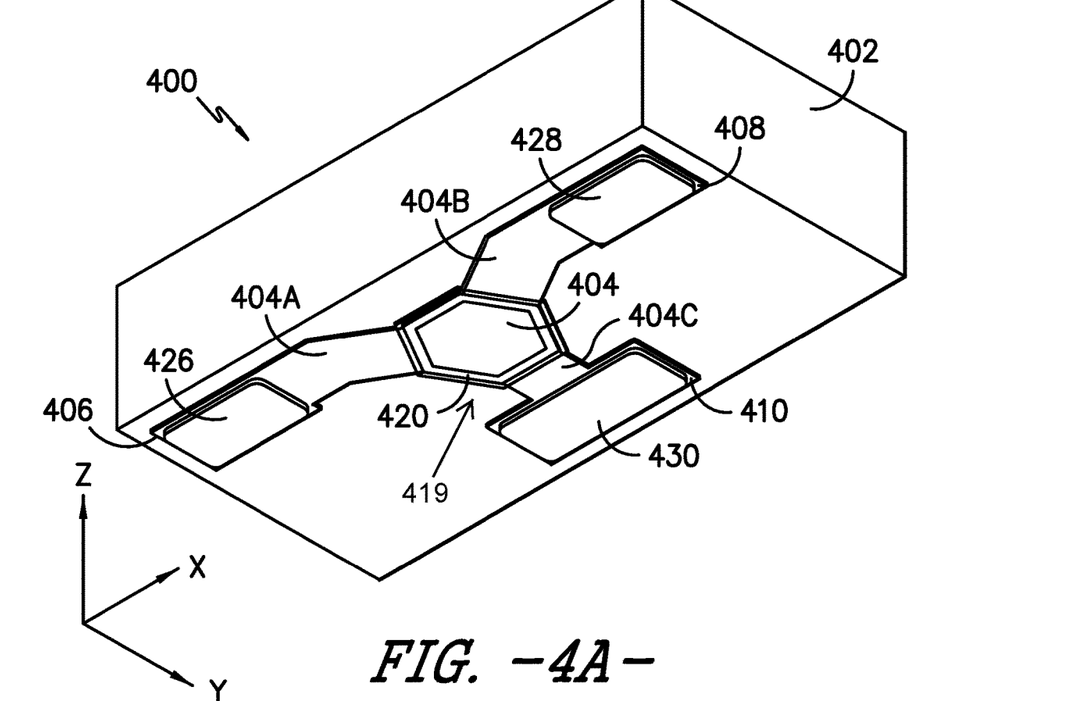
FIG. 4A is a perspective view of another embodiment of a resistive splitter according to aspects of the presently disclosed subject matter.
Figure 4B:
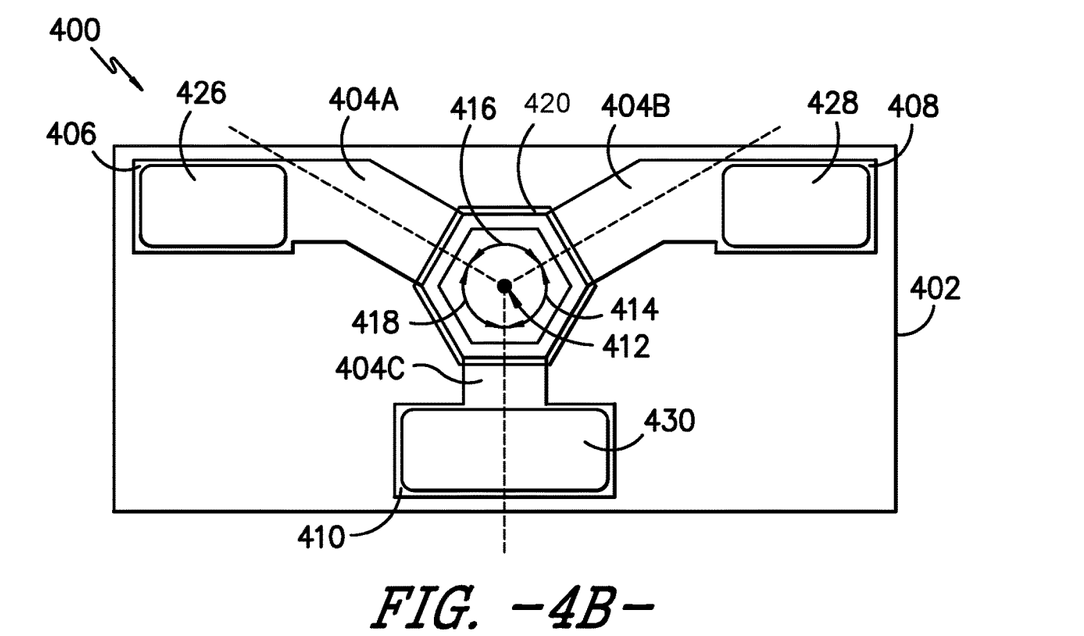
FIG. 4B is a top-down view of the resistive splitter of FIG. 4A according to aspects of the presently disclosed subject matter.

Referring now to FIGS. 4A, 4B, 5A, and 5B, in some embodiments, the resistive splitter may have other configurations. For example, FIG. 4A is a perspective view of one embodiment of a resistive splitter 400, and FIG. 4B is a top-down view of the resistive splitter 400 of FIG. 4A. The resistive splitter 400 can include a monolithic substrate 402 and a patterned resistive layer 404 formed over the monolithic substrate 402. The resistive splitter 400 can include a first terminal 406, a second terminal 408, and a third terminal 410. Each of the first terminal 406, the second terminal 408, and the third terminal 410 can be connected with the patterned resistive layer 404.

Further, as illustrated in FIGS. 4A and 4B, the patterned resistive layer 404 can include a first leg 404A extending from the first terminal 406 to a central point 412, a second leg 404B extending from the second terminal 408 to the central point 412, and a third leg 404C extending from the third terminal 410 to the central point 412. As shown in FIG. 4B, in some embodiments, the first leg 404A, second leg 404B, and third leg 404C can be equally spaced and distanced about the central point 412. For example, respective angles 414, 416, 418 can be formed between the legs 404A, 404B, 404C with respect to the central point 412.

Moreover, in some embodiments, the patterned resistive layer 404 can include a central portion 419 centered over the central point 412. The first leg 404A may be elongated and connected between the first terminal 406 and the central portion 419 of the patterned resistive layer 404, the second leg 404B may be elongated and connected between the second terminal 408 and the central portion 419 of the patterned resistive layer 404, and the third leg 404C may be elongated and connected between the third terminal 410 and the central portion 419 of the patterned resistive layer 404.

A frequency compensating conductive layer 420 can be formed about the central point 412, i.e., the frequency compensating conductive layer 420 can be centered with respect to the central point 412. As shown in the embodiment depicted in FIGS. 4A and 4B, the frequency compensating conductive layer 420 is hexagonal in shape. In some embodiments, such as illustrated in FIGS. 4A and 4B, the hexagon-shaped frequency compensating conductive layer 420 may consist of only a hexagon-shaped outline of material such that the frequency compensating conductive layer 420 does not overlie the central point 412. That is, in some embodiments, the frequency compensating conductive layer 420 is not a continuous piece of material from one edge to an opposite edge but, rather, the frequency compensating conductive layer 420 consists of material only adjacent its edges and not at a center of the shape.

One or more protective or passivation layers may be formed over the resistive layer(s) 404 and/or frequency compensating conductive layer 420. The terminals 406, 408, 410 can include respective vias 426, 428, 430 formed through the passivation layer(s) and exposed for surface mounting of the resistive splitter 400.

Comparing the embodiment of FIGS. 4A and 4B with the embodiments illustrated in FIGS. 1-3D, the terminals 406, 408, 410 may have a different shape than the terminals 106, 108, 110, 206, 208, 210, 306, 308, 310 and/or the vias 426, 428, 430 may have a different shape than the vias 126, 128, 130, 226, 228, 230, 326, 328, 330. For example, the terminals 106, 108, 110, 206, 208, 210, 306, 308, 310 shown in FIGS. 1-3D are generally square in shape with generally octagonal or circular vias 126, 128, 130, 226, 228, 230, 326, 328, 330, but the terminals 406, 408, 410 and vias 426, 428, 430 of the resistive splitter 400 are generally rectangular in shape.

Figure 5A:
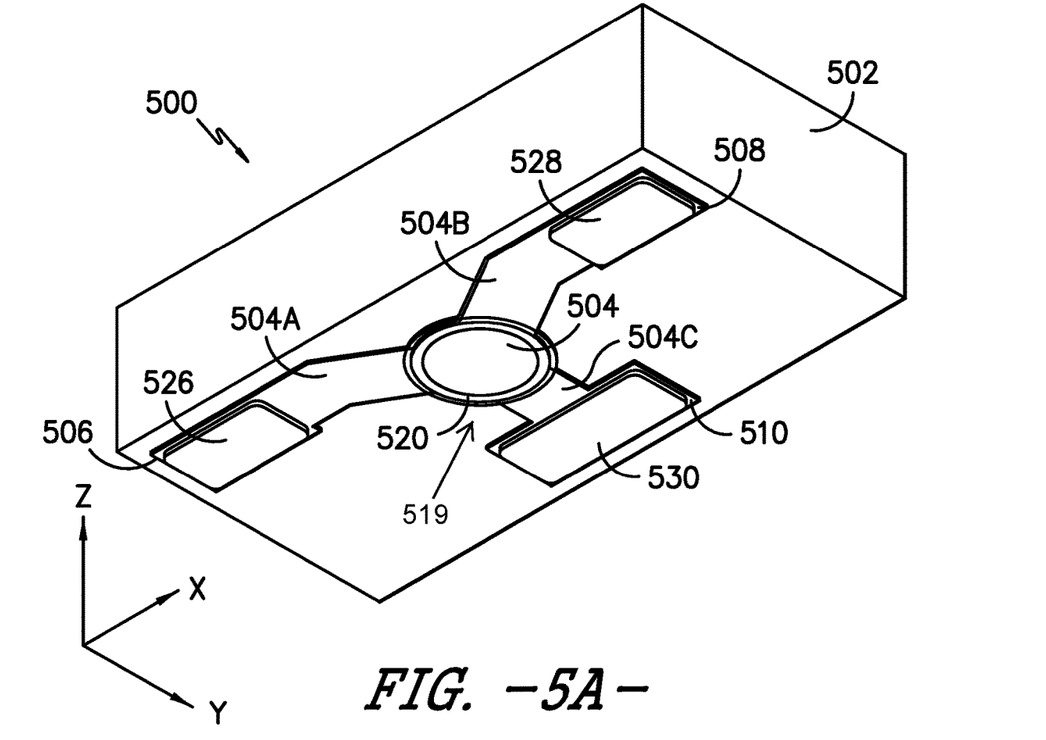
FIG. 5A is a perspective view of still another embodiment of a resistive splitter according to aspects of the presently disclosed subject matter.
Figure 5B:
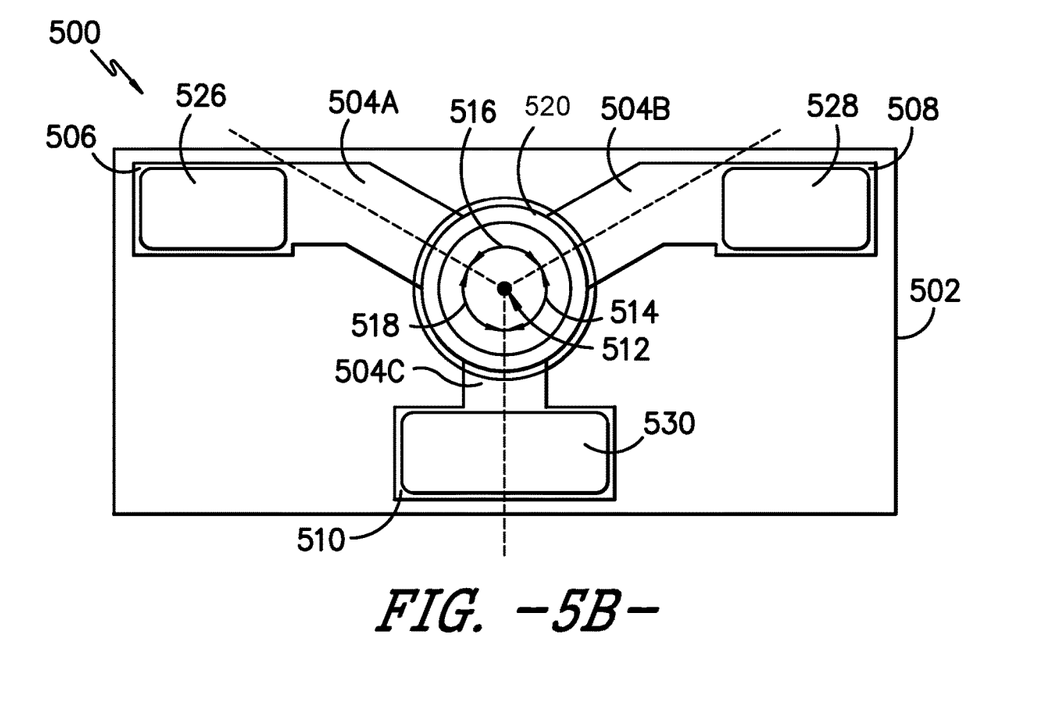
FIG. 5B is a top-down view of the resistive splitter of FIG. 5A according to aspects of the presently disclosed subject matter.

FIGS. 5A and 5B illustrate a resistive splitter 500 according to another embodiment of the present subject matter. The resistive splitter 500 generally is similar to the resistive splitter 400 illustrated in the embodiment of FIGS. 4A and 4B, but the resistive splitter 500 has a circular rather than hexagonal frequency compensating conductive layer 520. More particularly, the resistive splitter 500 can include a monolithic substrate 502 and a patterned resistive layer 504 formed over the monolithic substrate 502. The resistive splitter 500 can include a first terminal 506, a second terminal 508, and a third terminal 510. Each of the first terminal 506, the second terminal 508, and the third terminal 510 can be connected with the patterned resistive layer 504. The frequency compensating conductive layer 520 can be formed over the patterned resistive layer 504. One or more protective or passivation layers may be formed over the resistive layer(s) 504 and/or frequency compensating conductive layer 520. The terminals 506, 508, 510 can include respective vias 526, 528, 530 formed through the passivation layer(s) and exposed for surface mounting of the resistive splitter 500. As described with respect to the resistive splitter 400 illustrated in FIGS. 4A and 4B, the terminals 506, 508, 510 and/or vias 526, 528, 530 can have a different shape than the terminals 106, 108, 110, 206, 208, 210, 306, 308, 310 and/or the vias 126, 128, 130, 226, 228, 230, 326, 328, 330 illustrated in FIGS. 1-3D. In other embodiments, one or more of the terminals 406, 408, 410, 506, 508, 510 and/or vias 426, 428, 430, 526, 528, 530 can have the same shape as the terminals 106, 108, 110, 206, 208, 210, 306, 308, 310 and/or the vias 126, 128, 130, 226, 228, 230, 326, 328, 330.

Further, as illustrated in FIGS. 5A and 5B, the patterned resistive layer 504 can include a first leg 504A extending from the first terminal 506 to a central point 512, a second leg 504B extending from the second terminal 508 to the central point 512, and a third leg 504C extending from the third terminal 510 to the central point 512. As shown in FIG. 5B, in some embodiments, the first leg 504A, second leg 504B, and third leg 504C can be equally spaced and distanced about the central point 512. For instance, respective angles 514, 516, 518 can be formed between the legs 504A, 504B, 504C with respect to the central point 512.

Moreover, in some embodiments, the patterned resistive layer 504 can include a central portion 519 centered over the central point 512. The first leg 504A may be elongated and connected between the first terminal 506 and the central portion 519 of the patterned resistive layer 504, the second leg 504B may be elongated and connected between the second terminal 508 and the central portion 519 of the patterned resistive layer 504, and the third leg 504C may be elongated and connected between the third terminal 510 and the central portion 519 of the patterned resistive layer 504.

The frequency compensating conductive layer 520 can be formed about the central point 512, i.e., the frequency compensating conductive layer 520 can be centered with respect to the central point 512. As shown in the embodiment depicted in FIGS. 5A and 5B, the frequency compensating conductive layer 520 is circular in shape. In some embodiments, such as illustrated in FIGS. 5A and 5B, the circle-shaped frequency compensating conductive layer 520 may consist of only a circle-shaped outline of material such that the frequency compensating conductive layer 520 does not overlie the central point 512. That is, in some embodiments, the frequency compensating conductive layer 520 may be a ring of material centered on the central point 512 such that the frequency compensating conductive layer 520 is generally annular in shape and is not a continuous piece of material from one edge to an opposite edge but, rather, the frequency compensating conductive layer 520 consists of material only adjacent its edges and not at a center of the shape.

Figure 6A:
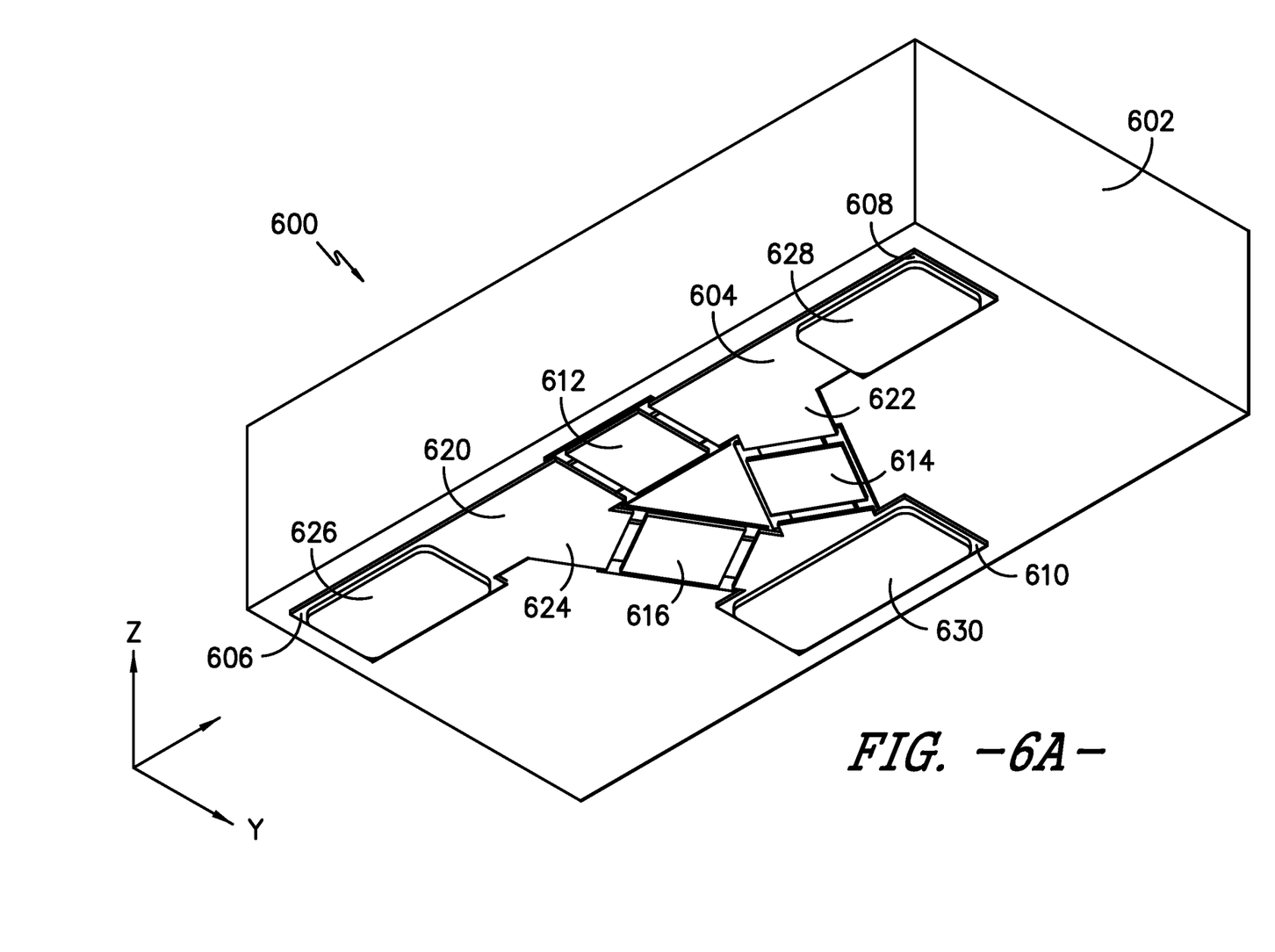
FIG. 6A is a perspective view of yet another embodiment of a resistive splitter according to aspects of the presently disclosed subject matter.
Figure 6B:
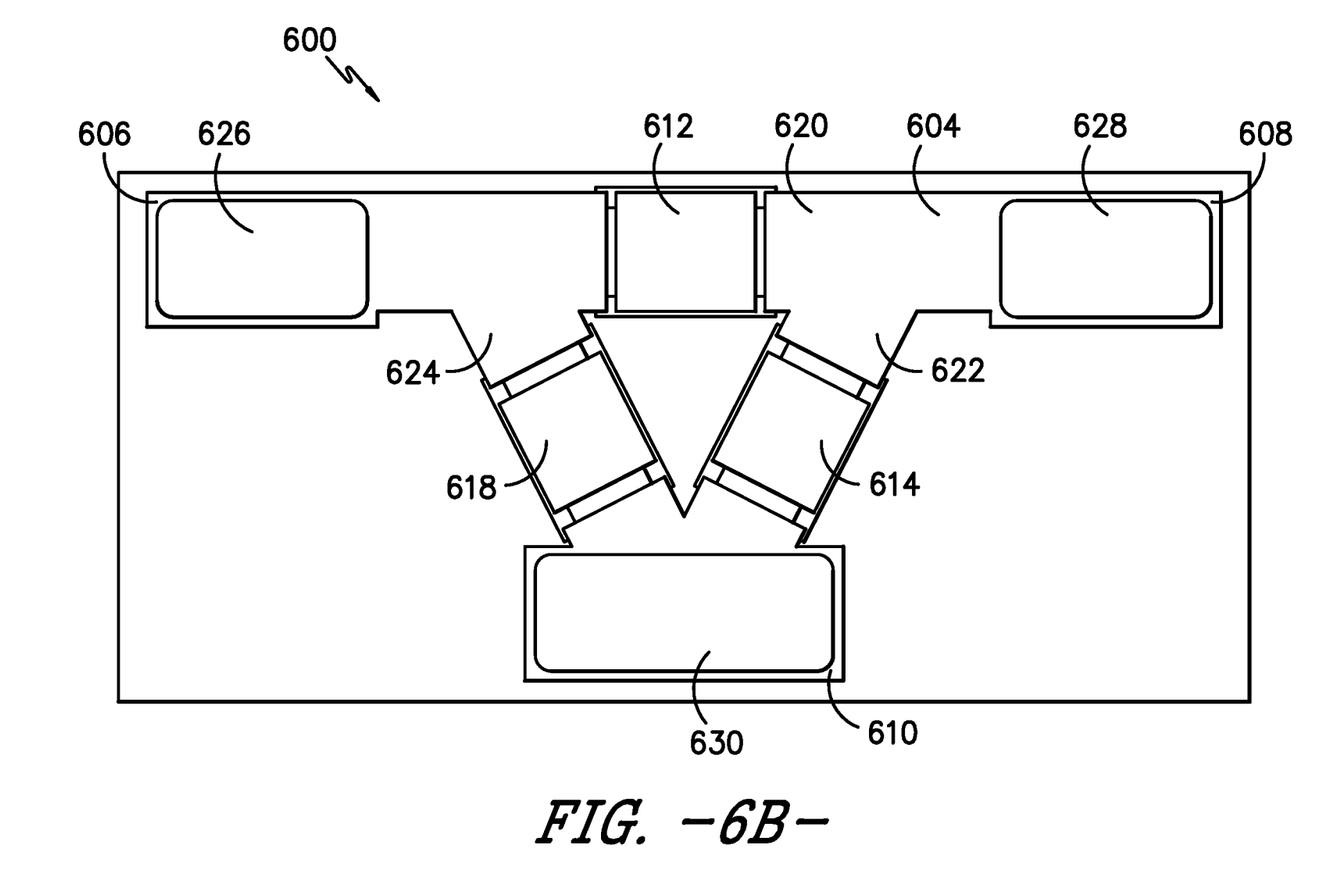
FIG. 6B is a top-down view of the resistive splitter of FIG. 6A according to aspects of the presently disclosed subject matter.

Turning now to FIGS. 6A and 6B, a resistive splitter 600 according to another embodiment of the present subject matter is illustrated in a perspective view (FIG. 6A) and a top-down view (FIG. 6B). The resistive splitter 600 generally is configured similarly to the exemplary resistive splitter 100 shown in FIG. 1 but in a triangular configuration rather than a generally T-shaped configuration as illustrated in the embodiment of FIG. 1. More specifically, the resistive splitter 600 can include a monolithic substrate 602 and a patterned resistive layer 604 formed over the monolithic substrate 602. The resistive splitter 600 can include a first terminal 606, a second terminal 608, and a third terminal 610. Each of the first terminal 606, the second terminal 608, and the third terminal 610 can be connected with the patterned resistive layer 604.

The patterned resistive layer 604 can form a first resistive path between the first terminal 606 and the second terminal 608. The patterned resistive layer 604 can form a second resistive path between the first terminal 606 and the third terminal 608. A ratio of a length of the first resistive path to a length of the second resistive path range from 0.9 to 1.1.

One or more frequency compensating conductive layers 612, 614, 616 can be formed over the patterned resistive layer 604. For example, a first frequency compensating conductive layer 612 can be formed over a first leg 620. A second frequency compensating conductive layer 614 can be formed over a second leg 622. A third frequency compensating conductive layer 616 can be formed over a third leg 624. As shown in FIGS. 6A and 6B, the first leg 620, second leg 622, and third leg 624 form a generally triangular shape, while the first leg 120, second leg 122, and third leg 124 of the embodiment shown in FIG. 1 generally form a T shape.

As shown in FIGS. 6A and 6B, in some embodiments, the first leg 620 can be elongated and connected between the first terminal 606 and the second terminal 608, the second leg 622 can be elongated and connected between the second terminal 608 and the third terminal 610, and the third leg 624 can be elongated and connected between the third terminal 610 and the first terminal 606. As previously described, in the depicted embodiment, the terminals 606, 608, 610 and legs 620, 622, 624 are arranged such that the legs 620, 622, 624 form a generally triangular shape.

In some embodiments, two or more of the frequency compensating conductive layers 612, 614, 616 can have the same or similar surface areas. For example, the first frequency compensating conductive layer 612 can have a first surface area. The second frequency compensating conductive layer 614 can have a second surface area that is approximately equal to the first surface area. For example, a ratio of the first surface area to the second surface area can range from about 0.9 to about 1.1. The third frequency compensating conductive layer 616 can have a third surface area that is approximately equal to the first surface area. For example, a ratio of the first surface area to the third surface area ranges from about 0.9 to about 1.1.

One or more protective or passivation layers may be formed over the resistive layer(s) 604 and/or frequency compensating conductive layers 612, 614, 616. The terminals 606, 608, 610 can include respective vias 626, 628, 630 formed through the passivation layer(s) and exposed for surface mounting of the resistive splitter 600.

Figure 7:
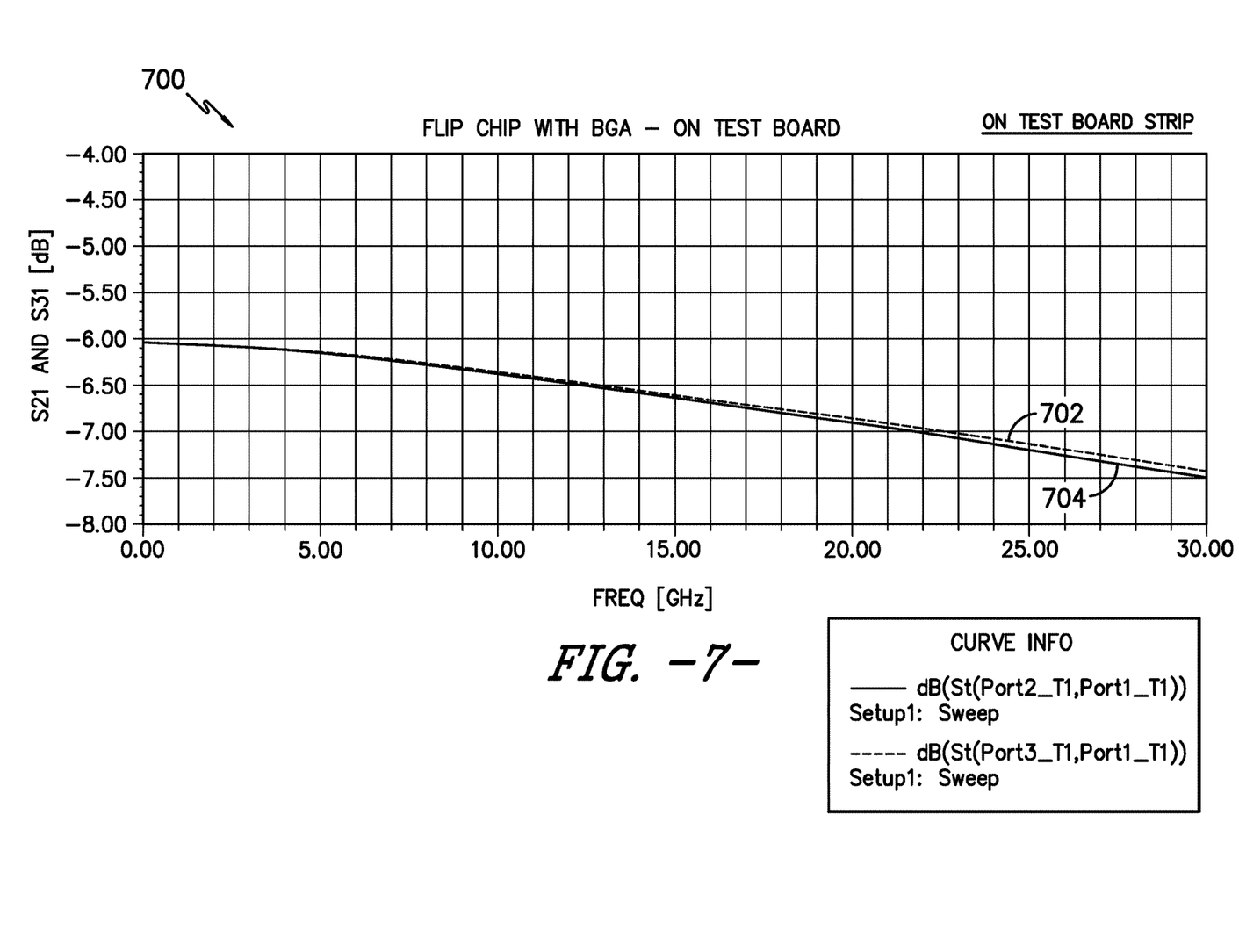
FIG. 7 illustrates a simulated insertion loss response curve for the resistive splitter of FIG. 1.

FIG. 7 illustrates a simulated insertion loss response curve 700 for the resistive splitter 100 of FIG. 1. The resistive splitter 100 exhibits a first insertion loss response 702 that is greater than about −10 dB for frequencies ranging from about 0 GHz to about 30 GHz between the first terminal 106 and the second terminal 108. The resistive splitter 100 exhibits a second insertion loss response 704 that is greater than about −10 dB for frequencies ranging from about 0 GHz to about 30 GHz between the first terminal 106 and the third terminal 110. The second insertion loss response 704 can vary from the first insertion loss 702 less than 3 dB for frequencies ranging from about 0 GHz to about 30 GHz.

Figure 8:
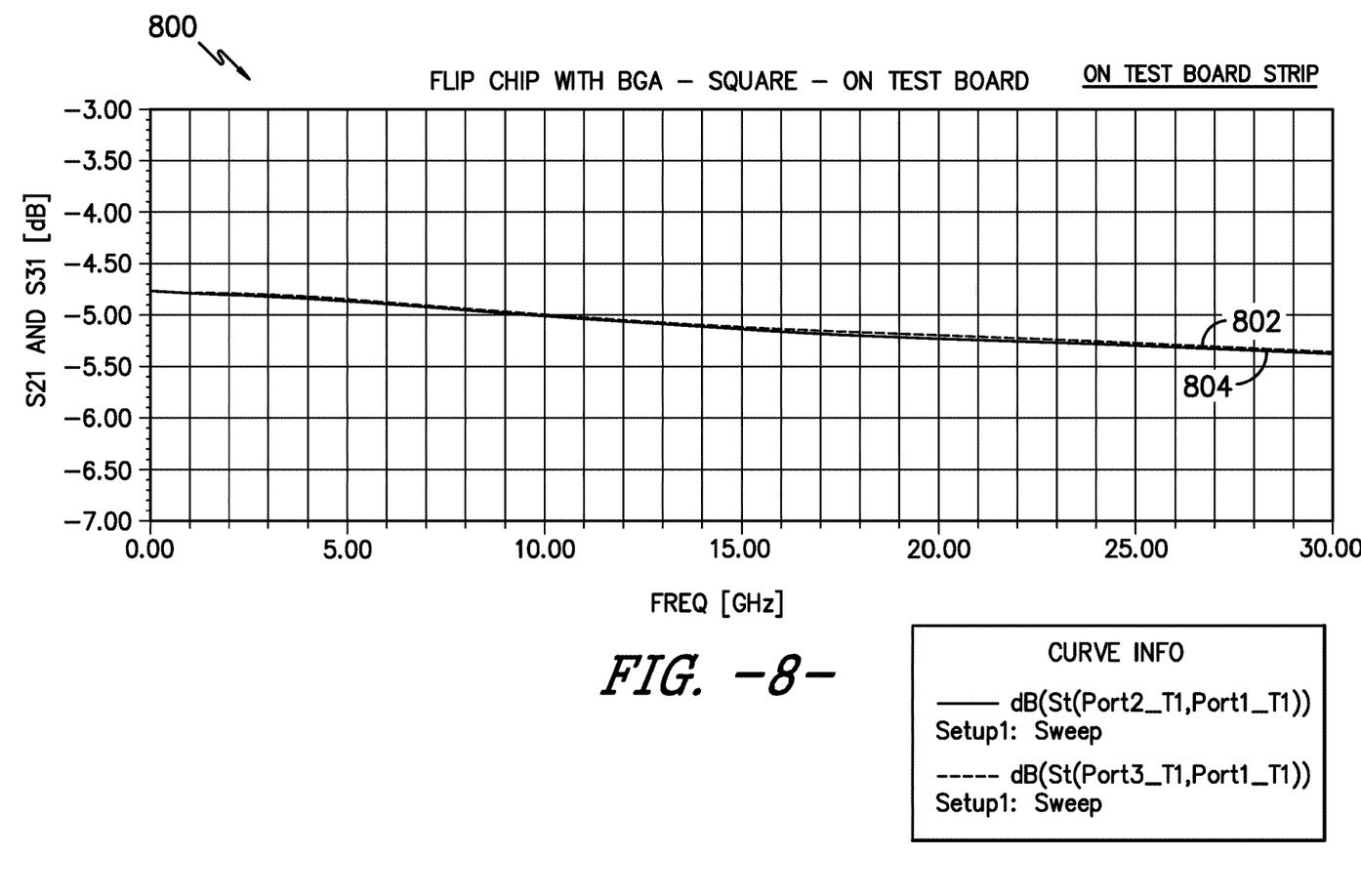
FIG. 8 illustrates a simulated insertion loss response curve for the resistive splitter of FIGS. 2A and 2B.

FIG. 8 illustrates a simulated insertion loss response curve 800 for the resistive splitter 200 of FIGS. 2A and 2B. The resistive splitter 200 exhibits a first insertion loss response 802 that is greater than about −10 dB for frequencies ranging from about 0 GHz to about 30 GHz between the first terminal 206 and the second terminal 208. The resistive splitter 200 exhibits a second insertion loss response 804 that is greater than about −10 dB for frequencies ranging from about 0 GHz to about 30 GHz between the first terminal 206 and the third terminal 210. The second insertion loss response 804 can vary from the first insertion loss 802 by less than 3 dB for frequencies ranging from about 0 GHz to about 30 GHz.

Figure 9:
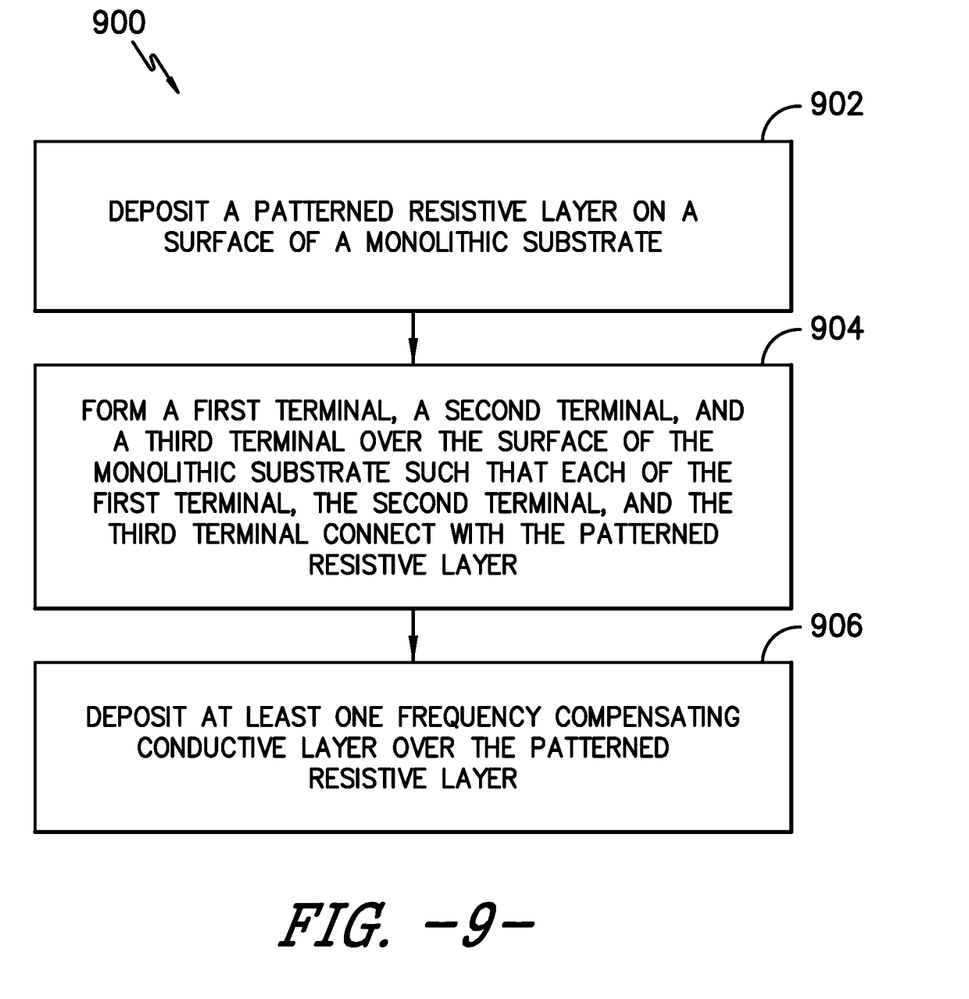
FIG. 9 is a flowchart of a method for forming a resistive splitter in accordance with aspects of the presently disclosed subject matter.

Referring to FIG. 9, aspects of the present disclosure are directed to a method 900 for forming a resistive splitter. In general, the method 900 will be described herein with reference to the resistive splitters 100, 200, 300, 400, 500, 60 described above with reference to FIGS. 1-6B. However, it should be appreciated that the disclosed method 900 may be implemented with any resistive splitters. In addition, although FIG. 9 depicts steps performed in a particular order for purposes of illustration and discussion, the methods discussed herein are not limited to any particular order or arrangement. One skilled in the art, using the disclosures provided herein, will appreciate that various steps of the methods disclosed herein can be omitted, rearranged, combined, and/or adapted in various ways without deviating from the scope of the present disclosure.

The method 900 can include, at 902, forming a patterned resistive layer 104, 204, 304, 404, 504, 604 on a surface of a monolithic substrate 102, 202, 302, 402, 502, 602. For example, a resistive material can be deposited using a variety of thin-film techniques as described herein. The resistive material can be etched to pattern the resistive layer 104, 204, 304, 404, 504, 604.

The method 900 can include, at 904, forming a first terminal 106, 206, 306, 406, 506, 606, a second terminal 108, 208, 308, 408, 508, 608, and a third terminal 110, 210, 310, 410, 510, 610 over the surface of the monolithic substrate 102, 202, 302, 402, 502, 602 such that each of the first terminal 106, 206, 306, 406, 506, 606, the second terminal 108, 208, 308, 408, 508, 608, and the third terminal 110, 210, 310, 410, 510, 610 connect with the patterned resistive layer 204, 304, 344. In some embodiments, the terminals 106, 206, 306, 406, 506, 606, 108, 208, 308, 408, 508, 608, 110, 210, 310, 410, 510, 610 can be arranged on the same surface of the respective monolithic substrate 102, 202, 302, 402, 502, 602 such that the resistive splitter 100, 200, 300, 400, 500, 600 is configured for grid array type mounting, such as land grid array, ball grid array, etc.

The method 900 can include, at 906, depositing at least one frequency compensating conductive layer over a portion of the patterned resistive layer 104, 204, 304, 404, 504, 604. For example, referring to FIG. 1, a first frequency compensating conductive layer 112 can be formed over the first leg 120 of the patterned resistive layer 104. A second frequency compensating conductive layer 114 can be formed over the second leg 122 of the patterned resistive layer 104. A third frequency compensating conductive layer 116 can be formed over the third leg 124 of the patterned resistive layer 104. The central portion 118 of the patterned resistive layer 104 can be free of any conductive layers formed thereover. As another example, FIG. 6 similarly depicts depositing one of a plurality of frequency compensating conductive layers 612, 614, 616 over a respective leg 620, 622, 624 of the patterned resistive layer 604.

In other embodiments, depositing the frequency compensating conductive layer(s) can include depositing a single frequency compensating conductive layer 220, 320, 360, 380, 420, 520 over the patterned resistive layer 204, 304, 404, 504, for example, as described above with reference to FIGS. 2A through 5B.

Test Methods

The following section provides example methods for testing a resistive splitter to insertion loss. The insertion loss response curves of the resistive splitter may be measured using a Keithley 2400 series Source Measure Unit (SMU), for example, a Keithley 2410-C SMU. A first insertion loss curve may be measured between the first terminal and second terminal. A second insertion loss curve may be measured between the first terminal and third terminal.

These and other modifications and variations of the present invention may be practiced by those of ordinary skill in the art, without departing from the spirit and scope of the present invention. In addition, it should be understood that aspects of the various embodiments may be interchanged both in whole or in part. Furthermore, those of ordinary skill in the art will appreciate that the foregoing description is by way of example only and is not intended to limit the invention so further described in such appended claims.

What is claimed is:

1. A resistive splitter comprising:
   a monolithic substrate;
   a patterned resistive layer formed over the monolithic substrate;
   a first terminal, a second terminal, and a third terminal each connected with the patterned resistive layer;
   at least one frequency compensating conductive layer formed over a portion of the patterned resistive layer,
   wherein the patterned resistive layer includes:
      a central portion;
      a first leg elongated and connected between the first terminal and the central portion of the patterned resistive layer;
      a second leg elongated and connected between the second terminal and the central portion of the patterned resistive layer; and
      a third leg elongated and connected between the third terminal and the central portion of the patterned resistive layer.

2. The resistive splitter of claim 1, wherein the patterned resistive layer forms a first resistive path between the first terminal and the second terminal and forms a second resistive path between the first terminal and the third terminal, and wherein a ratio of a length of the first resistive path to a length of the second resistive path range from 0.9 to 1.1.

3. The resistive splitter of claim 1, wherein the at least one frequency compensating conductive layer comprises aluminum, copper, gold, silver, nickel, or mixtures thereof.

4. The resistive splitter of claim 1, wherein the at least one frequency compensating conductive layer comprises:
   a first frequency compensating conductive layer formed over the first leg;
   a second frequency compensating conductive layer formed over the second leg;
   a third frequency compensating conductive layer formed over the third leg.

5. The resistive splitter of claim 4, wherein the central portion of the patterned resistive layer is free of any conductive layers formed thereover.

6. The resistive splitter of claim 4, wherein:
   the first frequency compensating conductive layer has a first surface area and the second frequency compensating conductive layer has a second surface area;
   a ratio of the first surface area to the second surface area ranges from about 0.9 to about 1.1.

7. The resistive splitter of claim 6, wherein the third frequency compensating conductive layer has a third surface area and a ratio of the first surface area to the third surface area ranges from about 0.9 to about 1.1.

8. The resistive splitter of claim 4, wherein the first leg, the second leg, and the third leg form a generally triangular shape.

9. The resistive splitter of claim 1, wherein the central portion is centered on a central point.

10. The resistive splitter of claim 1, wherein the frequency compensating conductive layer is centered on the central point, and wherein the frequency compensating conductive layer does not overlie the central point.

11. The resistive splitter of claim 10, wherein the frequency compensating conductive layer has a hexagonal shape.

12. The resistive splitter of claim 10, wherein the frequency compensating conductive layer has an annular shape.

13. The resistive splitter of claim 1, wherein the first terminal, the second terminal, and the third terminal are equally spaced and distanced about a central point.

14. The resistive splitter of claim 13, wherein the patterned resistive layer is formed over the central point, and wherein the at least one frequency compensating conductive layer is formed over the central point.

15. The resistive splitter of claim 14, wherein the patterned resistive layer has a circular shape that has a center aligned with the central point.

16. The resistive splitter of claim 14, wherein the patterned resistive layer has a triangular shape that has a center aligned with the central point.

17. The resistive splitter of claim 1, wherein the patterned resistive layer has a hexagonal shape.

18. The resistive splitter of claim 1, wherein the resistive splitter exhibits a first insertion loss response that is greater than about −10 dB for frequencies ranging from about 0 GHz up to about 30 GHz between the first terminal and the second terminal.

19. The resistive splitter of claim 18, wherein the resistive splitter exhibits a second insertion loss response between the first terminal and the third terminal that is greater than about −10 dB for frequencies ranging from about 0 GHz to about 30 GHz.

20. The resistive splitter of claim 18, wherein the second insertion loss response varies from the first insertion loss less than 3 dB for frequencies ranging from about 0 GHz to about 30 GHz.

21. The resistive splitter of claim 1, wherein the first terminal, the second terminal, and the third terminal are arranged on a same side of the monolithic substrate for grid array type mounting of the resistive splitter to a mounting surface.

22. A resistive splitter comprising:
a monolithic substrate;
a patterned resistive layer formed over the monolithic substrate; and
a first terminal, a second terminal, and a third terminal each connected with the patterned resistive layer,
wherein the patterned resistive layer includes:
a central portion;
a first leg elongated and connected between the first terminal and the central portion of the patterned resistive layer;
a second leg elongated and connected between the second terminal and the central portion of the patterned resistive layer; and
a third leg elongated and connected between the third terminal and the central portion of the patterned resistive layer, and
wherein the resistive splitter exhibits a first insertion loss response between the first terminal and the second terminal that is greater than about −10 dB for frequencies ranging from about 0 GHz up to about 30 GHz.

23. The resistive splitter of claim 22, wherein the resistive splitter exhibits a second insertion loss response between the first terminal and the third terminal that is greater than about −10 dB for frequencies ranging from about 0 GHz to about 30 GHz.

24. The resistive splitter of claim 22, wherein the second insertion loss response varies from the first insertion loss less than 3 dB for frequencies ranging from about 0 GHz to about 30 GHz.

25. The resistive splitter of claim 22, wherein:
the first terminal, the second terminal, and the third terminal are equally spaced and distanced about a central point; and
the patterned resistive layer is formed over the central point.

26. The resistive splitter of claim 22,
wherein each of the first leg, the second leg, and the third leg are centered with respect to a central point.

27. A method for forming a resistive splitter comprising:
forming a patterned resistive layer on a surface of a monolithic substrate;
depositing a first terminal, a second terminal, and a third terminal over the surface of the monolithic substrate such that each of the first terminal, the second terminal, and the third terminal connect with the patterned resistive layer; and
depositing at least one frequency compensating conductive layer over a portion of the patterned resistive layer,
wherein the patterned resistive layer includes:
a central portion;
a first leg elongated and connected between the first terminal and the central portion of the patterned resistive layer;
a second leg elongated and connected between the second terminal and the central portion of the patterned resistive layer; and
a third leg elongated and connected between the third terminal and the central portion of the patterned resistive layer.

28. A resistive splitter comprising:
a monolithic substrate;
a patterned resistive layer formed over the monolithic substrate; and
a first terminal, a second terminal, and a third terminal each connected with the patterned resistive layer,
wherein the patterned resistive layer includes:
a central portion;
a first leg elongated and connected between the first terminal and the central portion of the patterned resistive layer;
a second leg elongated and connected between the second terminal and the central portion of the patterned resistive layer; and
a third leg elongated and connected between the third terminal and the central portion of the patterned resistive layer,
wherein the resistive splitter exhibits a first insertion loss response between the first terminal and the second terminal and exhibits a second insertion loss response between the first terminal and the third terminal, and
wherein the second insertion loss response varies from the first insertion loss less than 3 dB for frequencies ranging from about 0 GHz to about 30 GHz.

29. The resistive splitter of claim 28, further comprising at least one frequency compensating conductive layer formed over a portion of the patterned resistive layer.

* * * * *